(12) United States Patent
Zhang et al.

(10) Patent No.: US 12,120,875 B2
(45) Date of Patent: Oct. 15, 2024

(54) STORAGE UNIT AND METHOD OF MANUFACTURING THE SAME AND THREE-DIMENSIONAL MEMORY

(71) Applicant: Institute of Microelectronics, Chinese Academy of Sciences, Beijing (CN)

(72) Inventors: Gang Zhang, Beijing (CN); Zongliang Huo, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 72 days.

(21) Appl. No.: 17/597,926

(22) PCT Filed: Jul. 29, 2019

(86) PCT No.: PCT/CN2019/098146
§ 371 (c)(1),
(2) Date: Jan. 28, 2022

(87) PCT Pub. No.: WO2021/016791
PCT Pub. Date: Feb. 4, 2021

(65) Prior Publication Data
US 2022/0262818 A1  Aug. 18, 2022

(51) Int. Cl.
*H10B 43/27* (2023.01)
(52) U.S. Cl.
CPC .................... *H10B 43/27* (2023.02)
(58) Field of Classification Search
CPC .................................................. H10B 43/27
See application file for complete search history.

(56) References Cited

U.S. PATENT DOCUMENTS

2012/0134215 A1  5/2012  Goda
2018/0040742 A1*  2/2018  Matsuo ................ H10B 43/35

FOREIGN PATENT DOCUMENTS

CN      102760740 A    10/2012
CN      110062958 A    7/2019

OTHER PUBLICATIONS

International Search Report issued in International Application No. PCT/CN2019/098146 dated May 8, 2020 (2 pages).
(Continued)

*Primary Examiner* — Nicholas J Tobergte
*Assistant Examiner* — Adin Hrnjic
(74) *Attorney, Agent, or Firm* — Osha Bergman Watanabe & Burton LLP

(57) ABSTRACT

A storage unit, a method of manufacturing the storage unit, and a three-dimensional memory. The storage unit includes: a first conductivity-type substrate; a channel layer stacked on the first conductivity-type substrate in a first direction; a second conductivity-type conduction layer including a first part and a second part that are connected, the first part being located between the first conductivity-type substrate and the channel layer, and the second part being formed in a via hole passing through the channel layer; a channel passage layer penetrating the channel layer and the first part in a negative direction of the first direction, and extending into an interior of the first conductivity-type substrate; and an insulating layer located in the channel layer and surrounding a periphery of the channel passage layer. The first conductivity-type substrate and the second conductivity-type conduction layer provide carriers required for reading and erasing operations, respectively.

9 Claims, 7 Drawing Sheets

(56) References Cited

OTHER PUBLICATIONS

Written Opinion issued in International Application No. PCT/CN2019/098146 dated May 8, 2020 (3 pages).

* cited by examiner

STORAGE UNIT AND METHOD OF MANUFACTURING THE SAME AND THREE-DIMENSIONAL MEMORY

CROSS REFERENCE TO RELATED APPLICATION(S)

This application is a Section 371 National Stage Application of International Application No. PCT/CN2019/098146, filed on Jul. 29, 2019, entitled "STORAGE UNIT AND METHOD OF MANUFACTURING THE SAME AND THREE-DIMENSIONAL MEMORY", the contents of which is incorporated herein by reference in its entirety.

TECHNICAL FIELD

The present disclosure relates to the field of semiconductor memory and integration technology, and relates to a storage unit, a method of manufacturing the storage unit, and a three-dimensional memory.

BACKGROUND

Three-dimensional NAND memory technology is currently the country's key development technology. Three-dimensional memory has experienced 32-layer, 64-layer and 96-layer, and is developing towards 128-layer. In the future, it will develop to 192 and 256 layers.

In a process of the three-dimensional memory, it is necessary to open an ONO insulating layer on the bottom through a dry etching process to connect a polysilicon channel hole layer and a substrate. With the increase in the number of layers and the height of the three-dimensional memory, the difficulty of the dry etching process increases sharply, therefore the probability of occurrence of connection defects between the polysilicon channel hole layer and the substrate increases sharply.

SUMMARY

According to an aspect of the present disclosure, a storage unit is provided, including: a first conductivity-type substrate; a channel layer stacked on the first conductivity-type substrate in a first direction; a second conductivity-type conduction layer including a first part and a second part that are connected, the first part being located between the first conductivity-type substrate and the channel layer, and the second part being formed in a via hole passing through the channel layer; a channel passage layer penetrating the channel layer and the first part of the second conductivity-type conduction layer in a negative direction of the first direction, and extending into an interior of the first conductivity-type substrate; and an insulating layer located in the channel layer and surrounding a periphery of the channel passage layer, wherein the first conductivity-type substrate and the second conductivity-type conduction layer provide carriers required for a reading operation and an erasing operation, respectively.

In some embodiments of the present disclosure, the first conductivity-type substrate is a p-type substrate, and the second conductivity-type conduction layer is an n-type conduction layer, the first conductivity-type substrate is configured to provide a hole pumped into the channel passage layer so as to achieve the erasing operation, and the second conductivity-type conduction layer is configured to provide an electron pumped into the channel passage layer to achieve the reading operation.

In some embodiments of the present disclosure, the channel layer includes a plurality of stack pairs, and each of the plurality of stack pairs includes a first stack material and a second stack material.

In some embodiments of the present disclosure, the first stack material is silicon oxide, and the second stack material is silicon nitride.

In some embodiments of the present disclosure, the insulating layer is a sandwich structure including a first sandwich material, a second sandwich material, and a third sandwich material.

In some embodiments of the present disclosure, the first sandwich material, the second sandwich material, and the third sandwich material are silicon oxide, silicon nitride and silicon oxide, respectively.

In some embodiments of the present disclosure, an ion concentration of the first part and an ion concentration of the second part are the same or different.

According to another aspect of the present disclosure, a method of manufacturing a storage unit is provided, including: preparing a first conductivity-type substrate; forming a channel layer stacked on the first conductivity-type substrate in a first direction; forming a second conductivity-type conduction layer including a first part and a second part that are connected, the first part being located between the first conductivity-type substrate and the channel layer, and the second part being formed in a via hole passing through the channel layer; forming a channel passage layer, wherein the channel passage layer penetrates the channel layer and the first part of the second conductivity-type conduction layer in a negative direction of the first direction, and extends into an interior of the first conductivity-type substrate; and forming an insulating layer located in the channel layer, wherein the insulating layer surrounds a periphery of the channel passage layer, wherein the first conductivity-type substrate and the second conductivity-type conduction layer provide carriers required for a reading operation and an erasing operation, respectively.

In some embodiments of the present disclosure, in the method, the first conductivity-type substrate is a p-type substrate, and the second conductivity-type conduction layer is an n-type conduction layer, the first conductivity-type substrate is configured to provide a hole pumped into the channel passage layer so as to achieve the erasing operation, and the second conductivity-type conduction layer is configured to provide an electron pumped into the channel passage layer to achieve the reading operation; optionally, in a process of forming the second conductivity-type conduction layer, a substrate of the storage unit is placed upwardly to form the second conductivity-type conduction layer.

According to another aspect of the present disclosure, a three-dimensional memory is provided, including any storage unit mentioned in the present disclosure.

BRIEF DESCRIPTION OF THE DRAWINGS

FIG. 1 is a schematic cross-sectional view of a block schematic part of the structure shown in FIG. 2.

FIG. 3 shows a schematic diagram of a structure obtained by forming a first channel hole and a common selection line conduction-hole layer in a first low-concentration conductivity-type extension layer and a channel layer, and depositing an insulating layer and a channel passage layer on an inner side and a bottom of the first channel hole.

FIG. 4 shows a schematic diagram of a structure obtained by removing a substrate of the structure shown in FIG. 3 to expose a surface of the first low-concentration conductivity-type extension layer, and forming a passivation layer on a top of the common selection line conduction-hole layer.

FIG. 5 shows a schematic diagram of a structure obtained by removing the first low-concentration conductivity-type extension layer of the structure shown in FIG. 4 by wet etching.

FIG. 6 shows a schematic diagram of a structure obtained by removing a part of a height the insulating layer and a part of a height of the channel layer of the structure shown in FIG. 5 by wet etching so that the channel passage layer and a bottom of the common selection line conduction-hole layer are exposed.

FIG. 7 shows a schematic diagram of a structure obtained by performing a second conductivity-type ion implantation on the common selection line conduction-hole layer of the structure shown in FIG. 6.

FIG. 8 shows a schematic diagram of a structure obtained by depositing a second conductivity-type cover layer on an exposed upper surface (in a negative z-axis direction) of the channel passage layer of the structure shown in FIG. 7.

FIGS. 9 to 12 show schematic diagrams of structures corresponding to steps of removing a part of the second conductivity-type cover layer covering the channel passage layer (in the negative z-axis direction) by photolithography according to an embodiment of the present disclosure, the part of the second conductivity-type cover layer protrudes outwardly relative to the second conductivity-type cover layer covering the surface of the channel layer.

FIG. 9 shows a schematic diagram of a structure obtained by depositing a mask layer such as a photosensitive layer on the structure shown in FIG. 8.

FIG. 10 shows a schematic diagram of a structure obtained after performing an exposure on the structure shown in FIG. 9.

FIG. 11 shows a schematic diagram of a structure obtained after etching the structure shown in FIG. 10.

FIG. 12 shows a schematic diagram of a structure obtained after removing the mask layer in the structure shown in FIG. 11.

FIG. 13 shows a schematic diagram of a structure obtained after depositing a material of the first conductivity-type substrate on the structure shown in FIG. 12.

DETAILED DESCRIPTION OF EMBODIMENTS

Figure 1:
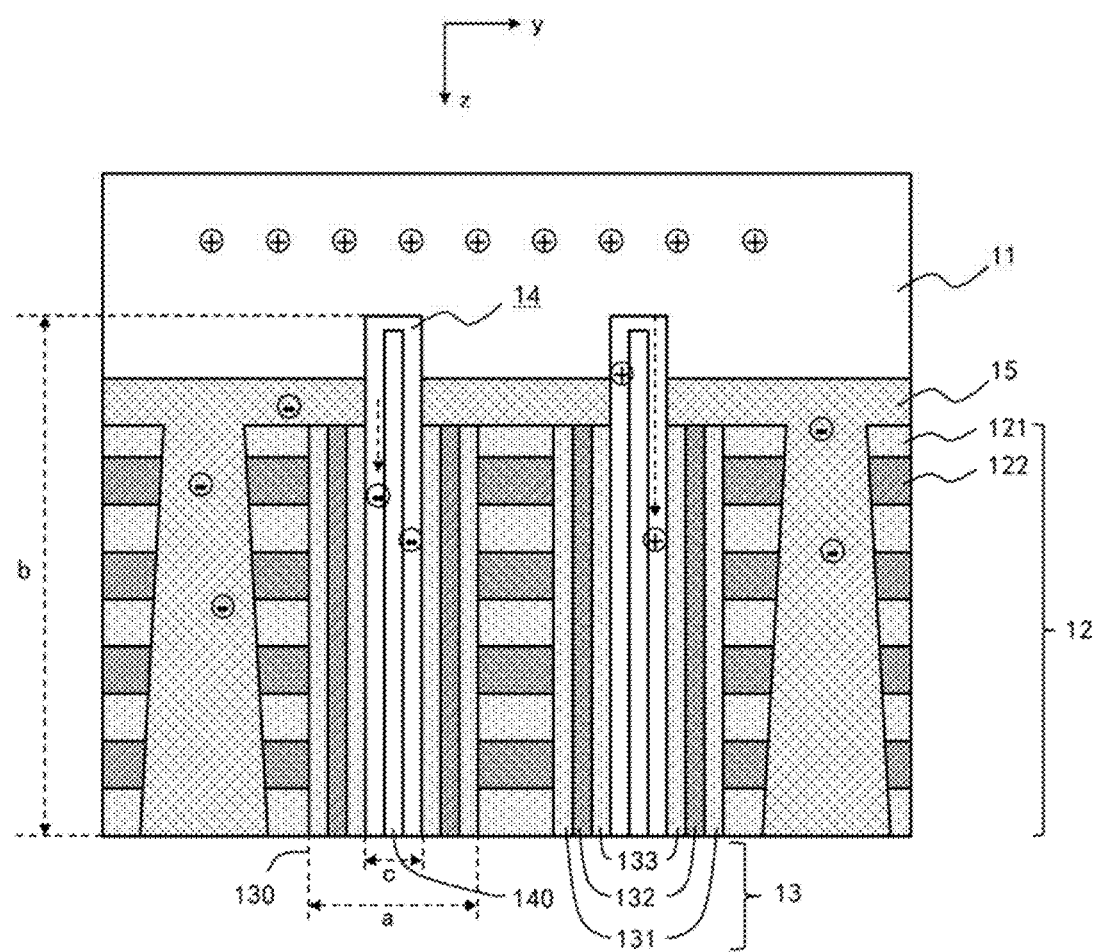
FIG. 1 shows a schematic structural diagram of a storage unit according to an embodiment of the present disclosure.

Existing main processes of connecting a polysilicon channel hole layer and a silicon substrate are as follows: (a) an insulating layer containing silicon oxide/silicon nitride/silicon oxide layer is deposited on an inner wall of a channel hole after the channel hole is dry-etched and formed; (b) a bottom of the insulating layer is opened through dry etching, for a 128-layer product, an aspect ratio of the dry etching process is not less than 180, for a 192-layer product, the aspect ratio of the dry etching process is greater than 200, to which there is currently no reliable process guarantee; (c) a polysilicon material is deposited on a sidewall and a bottom of the insulating layer to form a polysilicon channel hole layer to connect to the silicon substrate, so as to achieve an erasing function of the device.

In the above-mentioned solution, the larger the number of stacked layers, the higher the aspect ratio requirements will be. For example, for a 192-layer memory product, it is necessary to open the insulating layer by using dry etching so as to achieve the connection between the polysilicon channel hole layer and the substrate layer, the aspect ratio of the etching thereof is greater than 200, which is a very high requirement, and the probability of occurrence of connection defects (poor contact or no contact) between the polysilicon channel hole layer and the substrate has increased sharply. Therefore, for memories with larger number of stacked layers, the reliability to achieve the connection between the substrate and the channel hole layer according to the current manufacturing process is poor.

At present, there are two main ways to achieve the erasing of the memory: one is to erase through opening the bottom and bulk erasing, and to achieve the erasing by pumping holes of a P-type silicon substrate into the channel, this solution still needs to open the insulating layer, which cannot solve the problem of poor reliability mentioned above; the other is to erase by using sidewall hollowing and gate-induced drain leakage (GIDL) erasing, that is, to provide an electron and hole generating layer at the bottom, and to achieve erasing by pumping generated holes into the channel. The second solution avoids the process difficulty of opening the bottom, but it also brings about a problem of insufficient GIDL erasing ability. Therefore, there is currently no technical solution for erasing products with more than 128 layers through GIDL.

The present disclosure proposes a storage unit and a method of manufacturing the same and a three-dimensional memory. Based on a Xtacking three-dimensional memory architecture, a second conductivity-type conduction layer (N-type conduction layer) and a first conductivity-type substrate (P-type substrate) are arranged on the bottom (back side, in the negative z-axis direction shown in FIG. 1) of the storage unit, the first conductivity-type is opposite to the second conductivity-type, and the second conductivity-type conduction layer and the first conductivity-type substrate provide electrons required for the reading operation and holes required for the erasing operation, respectively. This structure is constructed from a back side (substrate side) of the storage unit, regardless of how the number of stacked layers of the storage unit increases, the construction of the second conductivity-type conduction layer is reversely completed on the back side (bottom) of the device, that is, the substrate of the storage unit is placed upwardly to form the second conductivity-type conduction layer, therefore it is not affected by the process difficulties caused by the continuous increase of the height of the three-dimensional memory, thereby effectively solving the problem that the etching process of preparing the memory with larger number (for example, more than 128 layers) of stacked layers in the related art cannot meet the high reliability.

In order to make objectives, technical solutions, and advantages of the present disclosure clearer, the present disclosure will be further described in detail below in conjunction with specific embodiments and with reference to the accompanying drawings.

In the present disclosure, coordinate axis directions of all the drawings are the same. For understanding, the structure corresponding to FIG. 1 and the placement direction in the manufacturing method are reversed. In the manufacturing method, "a top of a common selection line conduction-hole layer" and "a bottom of a common selection line conduction-hole layer" are described according to the placement direction during the manufacturing process, the "top of the common selection line conduction-hole layer" corresponds to a positive z-axis direction, and the "the bottom of the common selection line conduction-hole layer" corresponds to a negative z-axis direction. During the manufacturing process, the insulating layer is removed so that the channel passage layer and the bottom of the common selection line conduction-hole layer are exposed, and the manufacturing process are mainly performed on the bottom of the channel passage layer and the common selection line conduction-hole layer, and the actual operation at this time is to operate by reversely placing the device, so when describing the manufacturing method, the corresponding "upper surface of channel passage layer" is in the negative z-axis direction, and the rest of the description is similar, as long as those of ordinary skilled in the art may understand by comparing. In the description of structures, the coordinate axis directions indicated by the corresponding drawings are used for comparison and understanding, and some descriptions as "above" may be consistent with the corresponding descriptions as "below".

In an exemplary embodiment of the present disclosure, a storage unit is provided.

Figure 2:
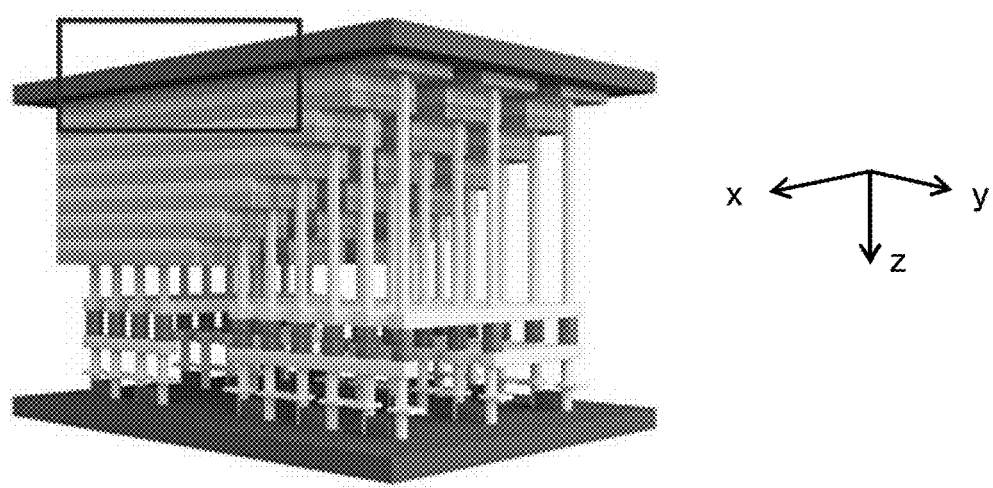
FIG. 2 shows a schematic diagram of a three-dimensional structure of a three-dimensional memory including the storage unit shown in FIG. 1.

FIG. 1 shows a schematic structural diagram of a storage unit according to an embodiment of the present disclosure. FIG. 2 shows a schematic diagram of a three-dimensional structure of a three-dimensional memory including the storage unit shown in FIG. 1. FIG. 1 is a schematic cross-sectional view of a block schematic part of the structure shown in FIG. 2. In FIG. 1, dashed arrows indicate transfer directions of carriers. During reading, for example, the second conductivity-type conduction layer 15 (N-type conduction layer) provides an electron pumped into the channel passage layer 14 to achieve the reading operation. During erasing, for example, the first conductivity-type substrate 11 provides a hole pumped into the channel passage layer 14 to achieve the erasing operation.

As shown in combination with FIG. 1 and FIG. 2, the storage unit of the present disclosure includes: a first conductivity-type substrate 11; a channel layer 12 stacked on the first conductivity-type substrate 11 in a first direction (positive z-axis direction); a second conductivity-type conduction layer 15 including a first part and a second part that are connected, the first part being located between the first conductivity-type substrate 11 and the channel layer 12, and the second part being formed in a via hole passing through the channel layer 12; and a channel passage layer 14 penetrating the channel layer 12 and the first part of the second conductivity-type conduction layer 15 in a negative direction of the first direction (negative z-axis direction), and extending into an interior of the first conductivity-type substrate 11; and an insulating layer 13 located in the channel layer 12, and surrounding a periphery of the channel passage layer 14. The first conductivity-type substrate 11 and the second conductivity-type conduction layer 15 respectively provide carriers required for reading and erasing operations.

The conductivity-types of the first conductivity-type substrate 11 and the second conductivity-type conduction layer 15 are opposite. In this embodiment, the first conductivity-type is a p-type, and the second conductivity-type is an n-type. Accordingly, the first conductivity-type substrate 11 is a p-type substrate, and the second conductivity-type conduction layer 15 is an n-type conduction layer. The p-type substrate provides holes required for the erasing operation, and the first conductivity-type substrate 11 provides the holes pumped into the channel passage layer 14 to achieve the erasing operation; the n-type conduction layer provides electrons required for the reading operation, and the second conductivity-type conduction layer 15 (N-type conduction layer) provides electrons pumped into the channel passage layer 14 to achieve the reading operation.

In an example, materials of the first conductivity-type substrate 11 and the second conductivity-type conduction layer 15 include, for example, polysilicon, but the conductivity-types of the two are opposite.

In this embodiment, referring to FIG. 1 and FIG. 8 to FIG. 12, the first part located between the first conductivity-type substrate 11 and the channel layer 12 is a part of a second conductivity-type cover layer 24 remaining after being etched and located on a same plane (the second conductivity-type cover layer 24 without a protruding part).

Figure 4:
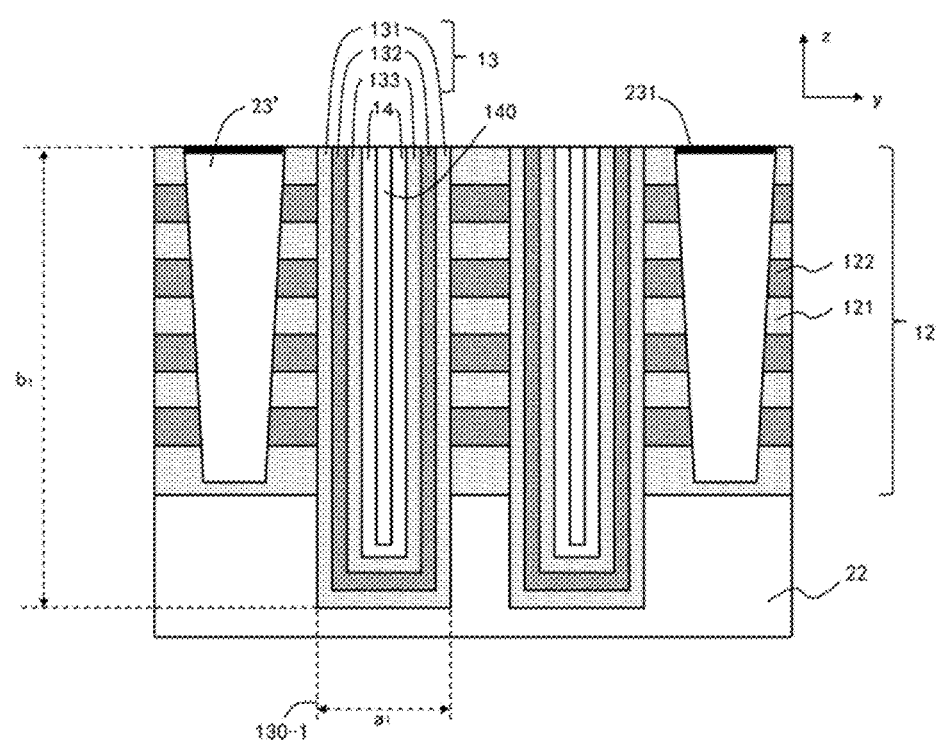

In this embodiment, the second part formed in the via hole passing through the channel layer 12 is a conduction-hole layer 23" after ion implantation, and the conduction-hole layer 23" after ion implantation is formed by performing second conductivity-type ion implantation on the common selection line conduction-hole layer 23. During the manufacturing process, as shown in FIG. 4, since the entire device structure needs to be wet-etched, in order to protect an exposed surface of the common selection line conduction-hole layer 23 from being corroded, a passivation layer 231 is first formed on the surface of the common selection line conduction-hole layer 23 to obtain the conduction-hole layer 23' having a top passivation layer. In order to highlight the improvement in the structure of FIG. 1, a top passivation layer (in positive z-axis direction) of the second conductivity-type conduction layer 15 is not shown.

In addition, n-type ion concentrations of the second part and the first part may be equal or unequal, as long as the second part and the first part can provide electron passages.

In this embodiment, the channel layer 12 includes a plurality of stack pairs, and each stack pair includes a first stack material 121 and a second stack material 122. In an example, the first stack material 121 is silicon oxide, and the second stack material 122 is silicon nitride.

In this embodiment, a material of the channel passage layer 14 is polysilicon. FIG. 1 shows a dimension of the channel hole 130 after the insulating layer 13 is deposited in the manufacturing process. A width (in a y direction) of the channel hole 130 is c and a depth (in a z direction) of the channel hole 130 is b, and a width of the channel hole 130 without depositing the insulating layer is a. In the structure of the storage unit of this embodiment, the channel passage layer 14 is deposited on a sidewall of the insulating layer 13 without fulfilling the channel hole 130. A cross section of the channel passage layer 14 is U-shaped. Therefore, FIG. 1 shows a gap 140 not filled by the channel passage layer 14.

In this embodiment, the insulating layer 13 in the resultant storage unit structure is only located in the channel layer 12. The insulating layer 13 surrounds the periphery of the channel passage layer 14 and does not surround the channel passage layer 14 in the first conductivity-type substrate 11 and the second conductivity-type conduction layer 15.

In an example, the insulating layer 13 is, for example, a sandwich structure including a first sandwich material 131, a second sandwich material 132, and a third sandwich material 133. The first sandwich material 131, the second sandwich material 132, and the third sandwich material 133 are, for example, silicon oxide, silicon nitride and silicon oxide, respectively.

In this embodiment, the second conductivity-type conduction layer (N-type conduction layer) and the first conductivity-type substrate (P-type substrate) are provided on the bottom (back side, in the negative z-axis direction shown in FIG. 1) of the storage unit, the first conductivity-type is opposite to the second conductivity-type, and the second conductivity-type conduction layer and the first conductivity-type substrate respectively provide electrons required for reading operation and holes required for erasing operation. For example, the concentration of holes can be adjusted by adjusting the injection concentration of the P-type polysilicon substrate, so as to achieve a reliable and high-speed erasing operation; the N-type conduction layer provides a channel for electron migration, so as to achieve the reading operation based on the electron channel provided by the conduction layer. This structure is constructed from the back side (substrate side) of the storage unit. Regardless of how the number of stacked layers of the storage unit increases, the construction of the second conductivity-type conduction layer is reversely completed on the back side (bottom) of the device. That is, the substrate of the storage unit is placed upwardly to form the second conductivity-type conduction layer, therefore it is not affected by the process difficulties caused by the continuous increase of the height of the three-dimensional memory, thereby effectively solving the problem that the etching process of preparing the memory with larger number (for example, more than 128 layers) of stacked layers in the related art cannot meet the high reliability.

In an exemplary embodiment of the present disclosure, a method of manufacturing a storage unit is provided.

FIGS. 3 to 13 show schematic diagrams of structures corresponding to respective steps of a method of manufacturing a storage unit according to an embodiment of the present disclosure.

In this embodiment, the method of manufacturing the storage unit includes the following steps.

Figure 3:
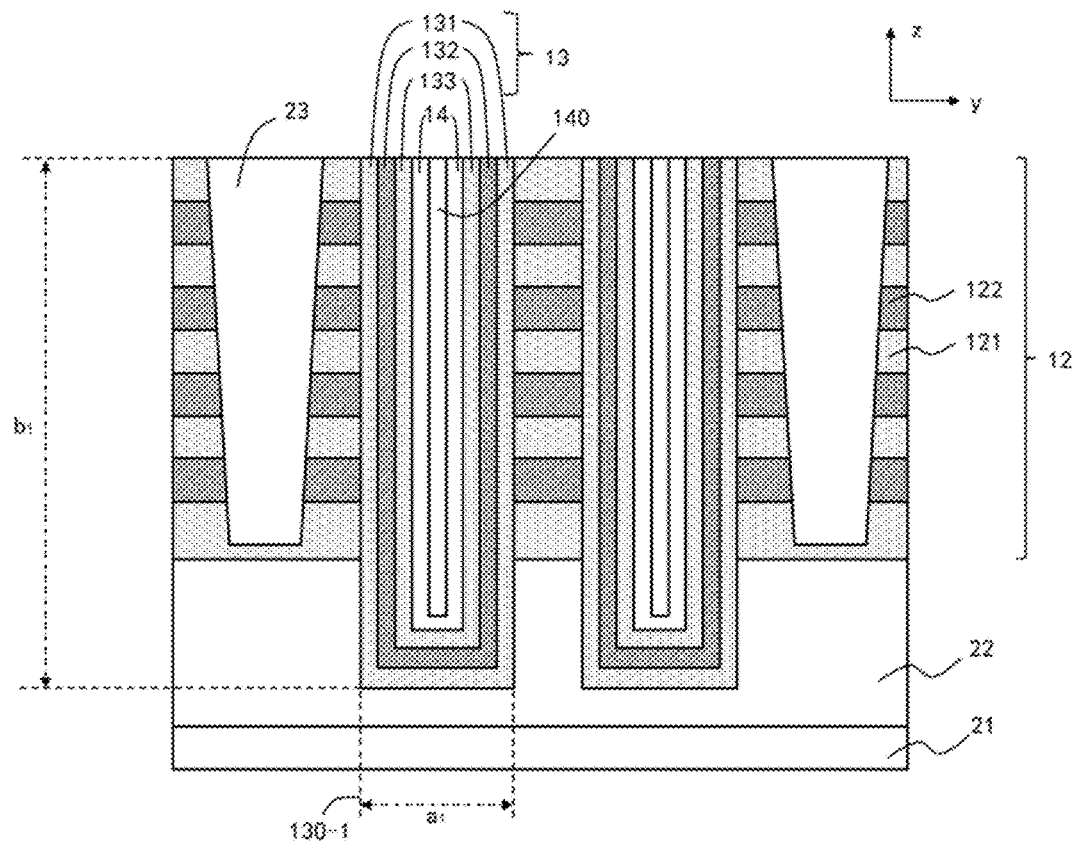
FIG. 3 to FIG. 13 show schematic diagrams of structures corresponding to respective steps in a method of manufacturing a storage unit according to an embodiment of the present disclosure.

In step S201, as shown in FIG. 3, a first channel hole 130-1 is formed in a first low-concentration conductivity-type extension layer 22 and a channel layer 12 above the substrate 21, a common selection line conduction-hole layer 23 is formed in the channel layer 12, and an insulating layer 13 and a channel passage layer 14 are deposited on an inner side and a bottom of the first channel hole 130-1.

In this embodiment, the first low-concentration conductivity-type extension layer 22 (p-type silicon extension layer 22) and the channel layer 12 are sequentially deposited on the substrate 21 (in the positive z-axis direction). The substrate 21 is, for example, a p-type silicon substrate. In the subsequent steps, wet-etching may be performed by using a high selectivity ratio of P-type silicon to P-type silicon, the wet etching may stop on the P-type silicon extension layer.

The first channel hole 130-1 is formed in the p-type silicon extension layer 22 and the channel layer 12, and the first channel hole 130-1 passes through the channel layer 12 and extends into the p-type silicon extension layer 22. As shown in FIG. 3, an etching dimension of the first channel hole is indicated with a width (in the y direction) as a1 and a depth (in the z direction) as bi. The insulating layer 13 is deposited in the first channel hole 130-1, and the insulating layer 13 is a sandwich structure containing a first sandwich material 131, a second sandwich material 132 and a third sandwich material 133. In this embodiment, the insulating layer 13 is a silicon oxide/silicon nitride/silicon oxide layer (O/N/O layer).

The common selection line conduction-hole layer 23 is formed in the channel layer 12. It should be noted that a common selection line conduction-hole is formed in the channel layer 12 through an etching process, and then, for example, a polysilicon material is deposited in the common selection line conduction-hole to obtain the common selection line conduction-hole layer 23.

In step S202, as shown in FIG. 4, the substrate 21 is removed so that a surface of the first low-concentration conductivity-type extension layer 22 is exposed, and the passivation layer 231 is formed on the top of the common selection line conduction-hole layer 23.

In this embodiment, the storage unit is used as a part of the three-dimensional memory, and a front of the storage unit needs to be attached to a front of a logic control unit.

After the storage unit and logic control unit are attached to each other, most of the thickness of the substrate 21 on the back side (the substrate side) of the storage unit is cut off by using chemical mechanical square grinding method, wet etching is performed by using the high selectivity ratio of P-type silicon to the P-type silicon (different in doping concentration), and it may stop on the P-type silicon extension layer 22. The operation of removing the substrate by wet etching in step S202 can be performed only on one side of the substrate 21 of the device without placing the entire device in an etching solution.

The step of forming the passivation layer 231 on the top of the common selection line conduction-hole layer 23 is for protecting the common selection line conduction-hole layer 23 (prevent it from being corroded) in the subsequent step of performing wet etching to remove the first low-concentration conductivity-type extension layer 22. In FIG. 4 and in the subsequent steps, a reference numeral 23' indicates the conduction-hole layer having the top passivation layer. The corresponding conduction-hole layer after ion implantation is indicated by 23".

Figure 5:
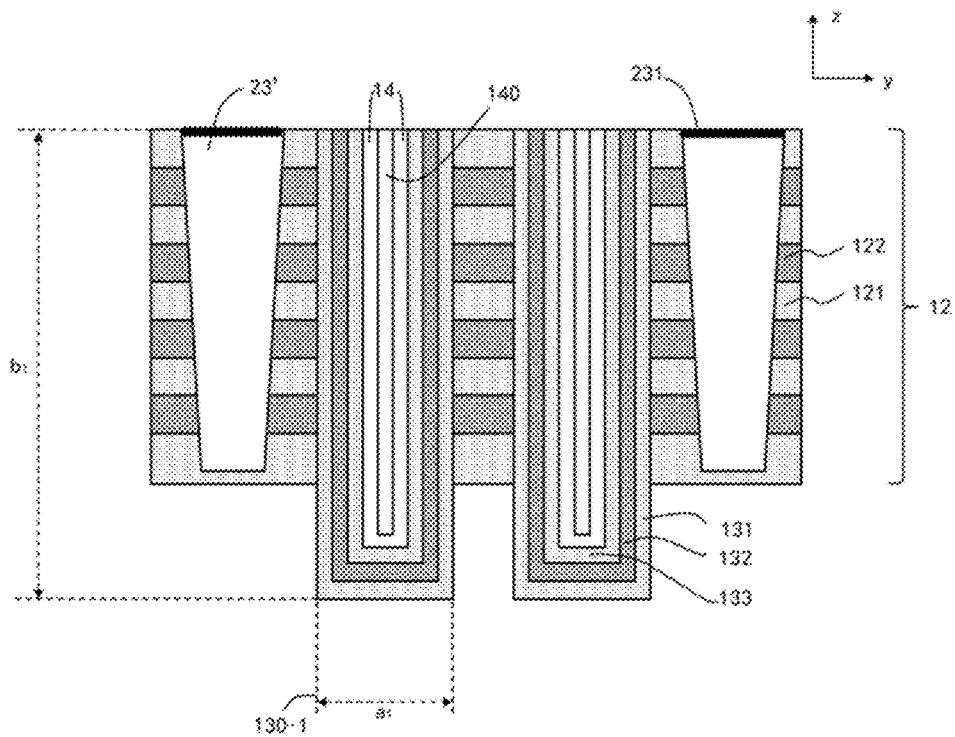

In step S203, as shown in FIG. 5, the first low-concentration conductivity-type extension layer 22 is removed.

In this embodiment, the P-type silicon extension layer 22 is removed by wet etching using the high selectivity ratio of silicon oxide to silicon, and an outer silicon oxide layer (first sandwich material 131) in the insulating layer 13 is exposed.

Figure 6:
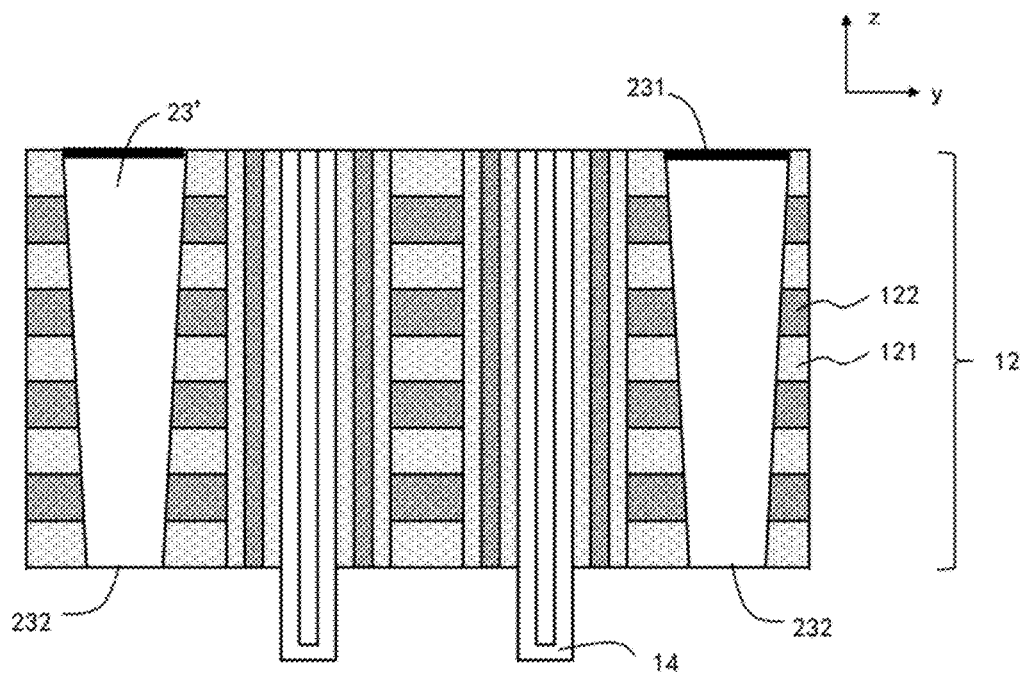

In step S204, as shown in FIG. 6, a part of a height of the insulating layer 13 and a part of a height of the channel layer 12 are removed, so that the channel passage layer 14 and a bottom 232 of the common selection line conduction-hole layer are exposed.

In this embodiment, the part of the height of the insulating layer 13 and the part of the height of the channel layer 12 protruding (in the negative z-axis direction) relative to the bottom 232 of the conduction-hole layer are removed, so that the channel passage layer 14 and the bottom 232 of the common selection line conduction-hole layer are exposed.

In this embodiment, the silicon oxide/silicon nitride/silicon oxide layer is removed by wet etching using the high selectivity ratio of silicon to silicon oxide, and the conduction-hole layer bottom 232 of the common selection line conduction-hole layer 23' having the top passivation layer and the channel passage layer 14 are exposed.

Figure 7:
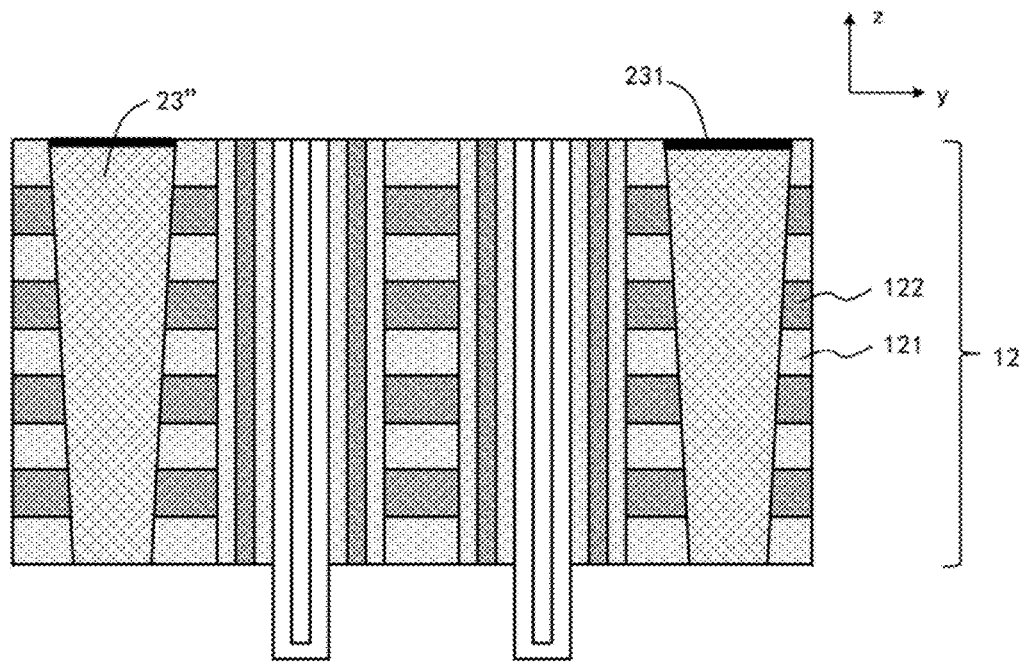

In step S205, as shown in FIG. 7, a second conductivity-type ion implantation is performed on the common selection line conduction-hole layer 23' having the top passivation layer, so as to obtain the conduction-hole layer 23" after ion implantation.

In this step, the concentration of ion implantation may be the same as or different from the ion concentration in a second conductivity-type cover layer 24 formed in the subsequent step, as long as it meets the concentration requirement for providing an electron channel.

Figure 8:
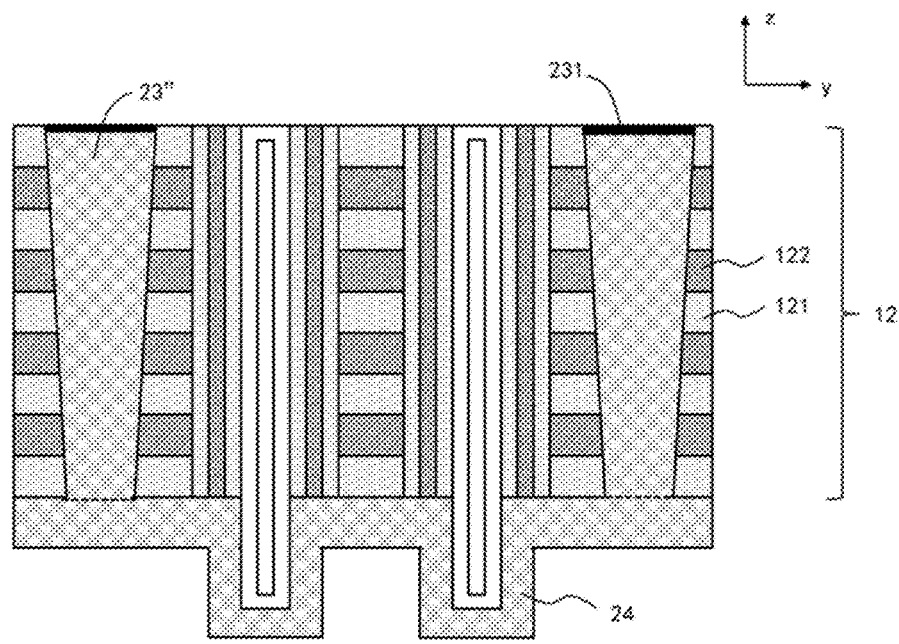

In step S206, as shown in FIG. 8, the second conductivity-type cover layer 24 is deposited on the exposed upper surface (negative z-axis direction) of the channel passage layer 14.

In this embodiment, in actual manufacturing processes corresponding to FIG. 8 and subsequent drawings, it is required to perform the manufacturing process on the back side of the device (in the negative z-axis direction). Therefore, the device is actually reversely processed. Therefore, in the following description, "up" corresponds to the negative z-axis direction, and "down" corresponds to the positive z-axis direction.

In this embodiment, the second conductivity-type cover layer 24 is deposited on the exposed upper surface of the channel passage layer 14. The second conductivity-type cover layer 24 is, for example, an n-type silicon. The second conductivity-type cover layer 24 and the conduction-hole layer 23" after ion implantation are actually connected as one structure. Therefore, in order to emphasize the corresponding operation of this step, a dotted line is shown between the deposited second conductivity-type cover layer 24 and the ion implanted conduction-hole layer 23". The two are actually connected as a whole in this step. It should be understood that the dotted line will not be shown in the subsequent steps. The structure in which the second conductivity-type cover layer 24 and the ion-implanted conduction-hole layer 23" are integrally connected is a precursor of a corresponding second conductivity-type conduction layer 15 in a subsequent device structure. The second conductivity-type conduction layer 15 is obtained after a patterning process.

The patterning process will be described in detail in the following steps.

In step S207, a part of the second conductivity-type cover layer 24 corresponding to a protruding part of the channel passage layer 14 is removed so that the second conductivity-type cover layer 24 is located on a same plane, and the protruding part of the channel passage layer 14 is exposed.

FIGS. 9 to 12 show schematic structural diagrams corresponding to removing part of the second conductivity-type cover layer covering the channel passage layer (in the negative z-axis direction) by photolithography according to an embodiment of the present disclosure, and this part of the second conductivity-type cover layer protrudes outwardly with respect to the second conductivity-type cover layer covering the surface of the channel layer.

Figure 9:
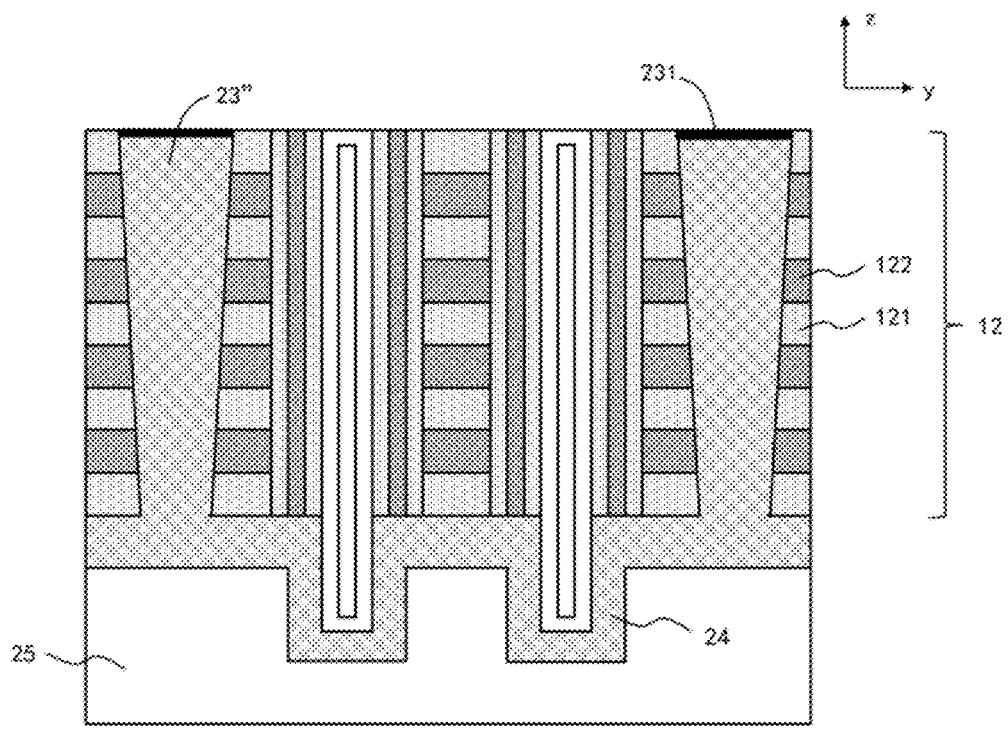
Figure 10:
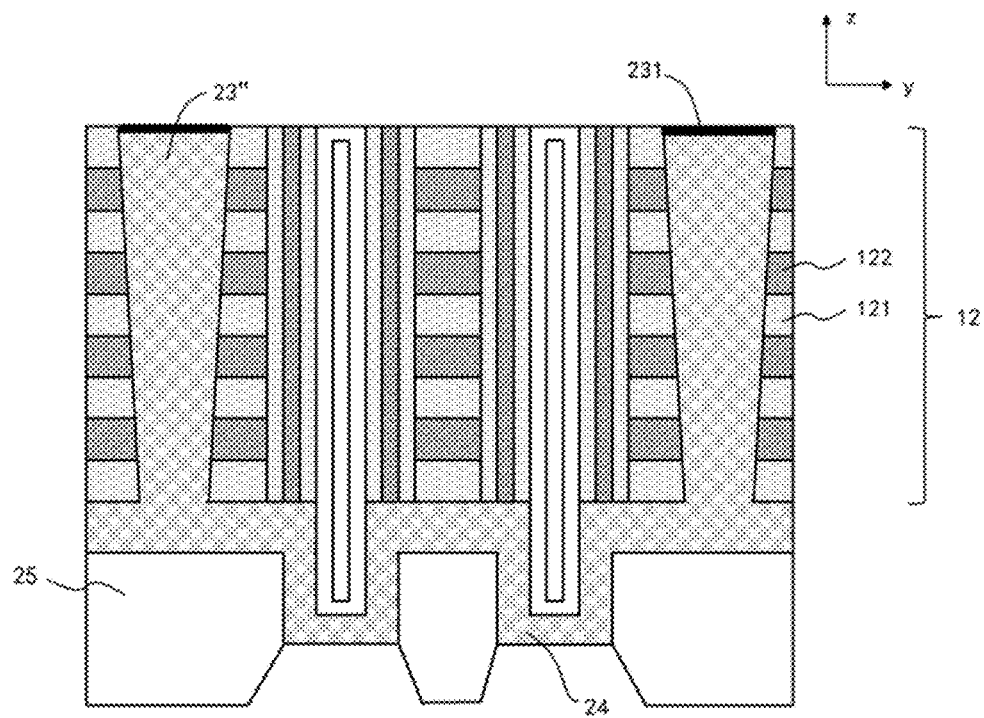
Figure 11:
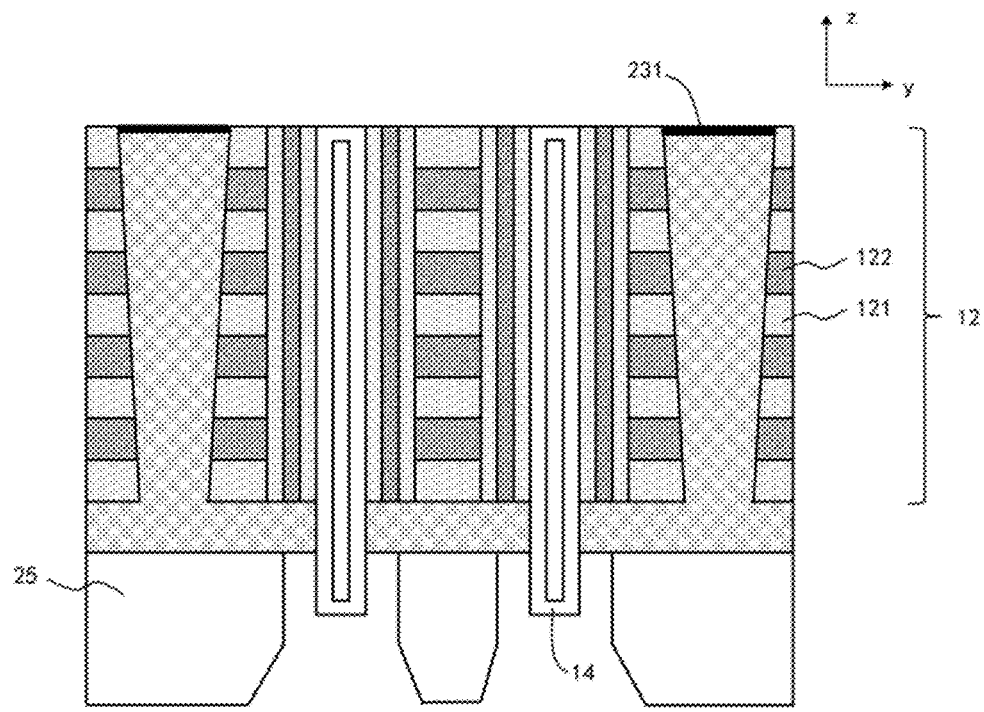
Figure 12:
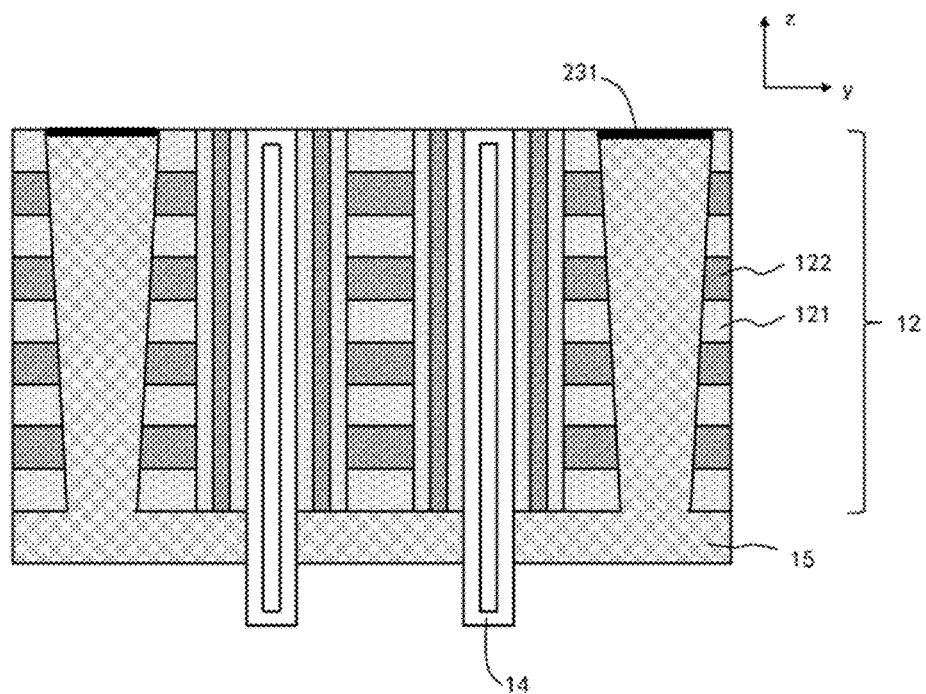

In this embodiment, in removing the second conductivity-type cover layer 24 corresponding to the protruding part of the channel passage layer 14 by photolithography, a mask layer 25 is deposited first as shown in FIG. 9, the mask layer 25 is, for example, a photosensitive layer. Then, an exposure is performed on the mask layer 25, as shown in FIG. 10, the part of the second conductivity-type cover layer 24 that protrudes outward relative to the second conductivity-type cover layer 24 covering the surface of the channel layer is exposed by the exposed photosensitive layer, and the protruding part of the second conductivity-type cover layer 24 is etched. As shown in FIG. 11, in this embodiment, wet etching is used to remove a part of N-type silicon by using a selective ratio of undoped silicon to N-type silicon, so that the second conductivity-type cover layer 24 is located on a same plane and the protruding part of the polysilicon channel passage layer 14 is exposed. Finally, as shown in FIG. 12, the photosensitive layer is removed by wet etching.

Figure 13:
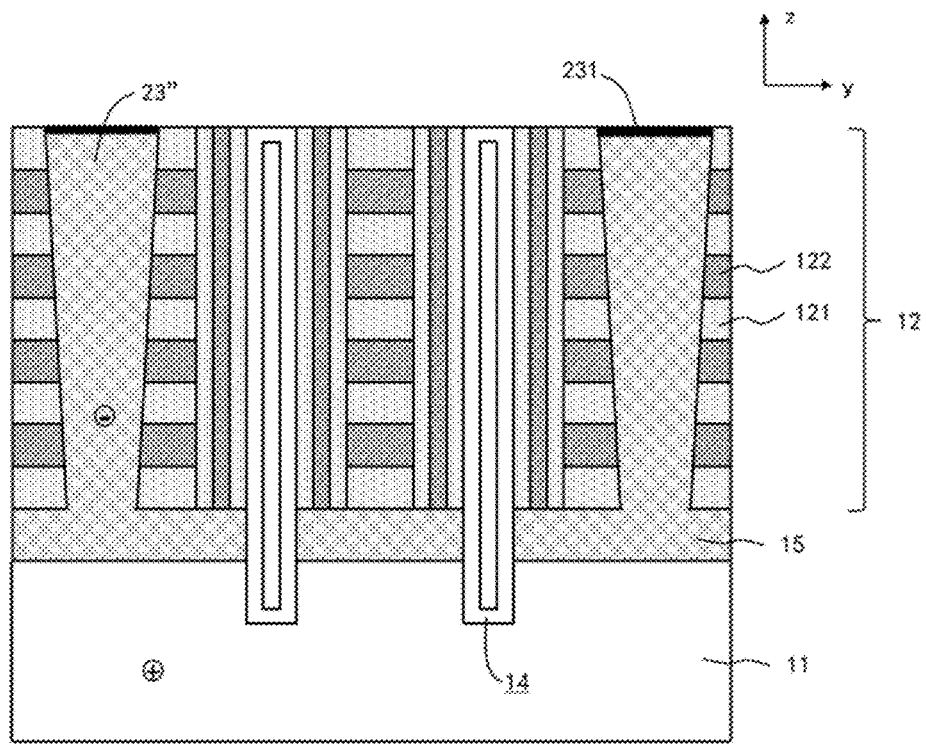

In step S208, as shown in FIG. 13, a material of the first conductivity-type substrate is deposited on the structure formed in step S207, to complete the manufacture of the storage unit.

The structural diagram shown in FIG. 13 and the structural diagram shown in FIG. 1 are reversed. In FIG. 13, in the manufacturing processes described above, the passivation layer 231 is provided on the top of the common selection line conduction-hole layer 23 to play a protection role in implementing the wet etching process in each step. It should be understood that, in other steps, in order to protect a certain material layer, the passivation layer (for example, an oxide layer) may be formed according to actual desires. In addition, when the wet etching process is used to perform a highly selective etching process, the passivation layer may be a silicon oxide layer or a layer of other materials, which can be adjusted according to the etching solution. In addition, the process of removing part of the structure is not limited to the above-mentioned wet etching and photolithography processes, and may be a combination of the two or other dry etching or wet etching processes.

It should be noted that the above-mentioned embodiments of respective steps are only examples, illustrating how to implement the processes of manufacturing the storage unit of the present disclosure on an existing device structure. In the present disclosure, any manufacturing process that can form the structures and mutual positional relationships of parts of the storage unit described above are within the protection scope of the present disclosure.

In an exemplary embodiment of the present disclosure, a three-dimensional memory is provided, including any storage unit mentioned in the present disclosure.

In this embodiment, the three-dimensional memory further includes a logic control unit, and the front of the storage unit and the front of the logic control unit are attached to each other.

In summary, the present disclosure provides a storage unit and a method of manufacturing the same and a three-dimensional memory. The second conductivity-type conduction layer (for example, the N-type conduction layer) and the first conductivity-type substrate (for example, the P-type substrate) are provided on the bottom (back side, in the negative z-axis direction shown in FIG. 1) of the storage unit, and the second conductivity-type conduction layer and the first conductivity-type substrate respectively provide electrons required for reading operation and holes required for erasing operation. For example, the concentration of holes may be adjusted by adjusting the injection concentration of the P-type polysilicon substrate, so as to achieve a reliable and high-speed erasing operation; the N-type conduction layer provides a channel for electron migration, so that the reading operation may be achieved based on the electron channel provided by the conduction layer. The structure is constructed from the back side (substrate side) of the storage unit. Regardless of how the number of stacked layers of the storage unit increases, the construction of the second conductivity-type conduction layer is reversely completed on the back side (bottom) of the device. That is, the substrate of the storage unit is placed upwardly to form the second conductivity-type conduction layer, so it is not affected by the process difficulties caused by the continuous increase of the height of the three-dimensional memory, and it is suitable for the effective conduction of higher-layer stacking (for example, 128 and above stacking layers) of storage units. Thereby effectively solving the problem that the etching process of preparing the memory with high number (for example, more than 128 layers) of stacked layers in the related art cannot meet the high reliability.

Throughout the drawings, the same elements are represented by the same or similar reference numerals. When it may cause confusion in the understanding of the present disclosure, existing structures or configurations will be omitted. In addition, the shapes and dimensions of the components in the figures do not reflect the actual dimensions and scales, but merely illustrate the content of the embodiments of the present disclosure. In addition, in the claims, any reference numerals placed between parentheses should not be constructed as a limitation to the claims.

The ordinal numbers used in the description and claims, such as "first", "second", "third", etc., are used to modify the corresponding elements. It does not mean that the element itself has any ordinal numbers, nor does it mean the order of a certain element and another element, or the order in the manufacturing method. The use of these ordinal numbers is only used to clearly distinguish one element with a certain name from another element with the same name. Furthermore, the word "comprising" or "including" does not exclude the presence of elements or steps not listed in the claims. The word "a" or "an" preceding an element does not exclude the presence of a plurality of such elements.

Unless there are technical obstacles or contradictions, the various features in the above-mentioned embodiments of the present disclosure can be freely combined to form additional embodiments, and these additional embodiments are all within the protection scope of the present disclosure.

The specific embodiments described above further describe the purpose, technical solutions and beneficial effects of the present disclosure in detail. It should be understood that the above-mentioned specific embodiments are only specific embodiments of the present disclosure, and are not intended to limit the present disclosure. Any modification, equivalent replacement, improvement, etc. made within the spirit and principle of the present disclosure should be included within the protection scope of the present disclosure.

What is claimed is:

1. A storage unit, comprising:
    a first conductivity-type substrate;
    a channel layer stacked on the first conductivity-type substrate in a first direction;
    a second conductivity-type conduction layer comprising a first part and a second part that are connected, the first part being located between the first conductivity-type substrate and the channel layer, and the second part being formed in a via hole passing through the channel layer;
    a channel passage layer penetrating the channel layer and the first part of the second conductivity-type conduction layer in a negative direction of the first direction, and extending into an interior of the first conductivity-type substrate; and
    an insulating layer located in the channel layer and surrounding a periphery of the channel passage layer,
    wherein a surface of the insulating layer facing the first conductivity-type substrate and in contact with the first part of the second conductivity-type conduction layer is flush with a bottommost surface of the channel layer facing the first conductivity-type substrate and in contact with the first part of the second conductivity-type conduction layer, and
    wherein the first conductivity-type substrate is a p-type substrate, and the second conductivity-type conduction layer is an n-type conduction layer, the first conductivity-type substrate is configured to provide a hole pumped into the channel passage layer so as to achieve an erasing operation, and the second conductivity-type conduction layer is configured to provide an electron pumped into the channel passage layer to achieve a reading operation.

2. The storage unit according to claim 1, wherein the channel layer comprises a plurality of stack pairs, and each of the plurality of stack pairs comprises a first stack material and a second stack material.

3. The storage unit according to claim 2, wherein the first stack material is silicon oxide, and the second stack material is silicon nitride.

4. The storage unit according to claim 1, wherein the insulating layer is a sandwich structure comprising a first sandwich material, a second sandwich material, and a third sandwich material.

5. The storage unit according to claim 4, wherein the first sandwich material, the second sandwich material, and the third sandwich material are silicon oxide, silicon nitride and silicon oxide, respectively.

6. The storage unit according to claim 1, wherein an ion concentration of the first part and an ion concentration of the second part are the same or different.

7. A method of manufacturing a storage unit, comprising:
    preparing a first conductivity-type substrate;
    forming a channel layer stacked on the first conductivity-type substrate in a first direction;
    forming a second conductivity-type conduction layer comprising a first part and a second part that are connected, the first part being located between the first conductivity-type substrate and the channel layer, and the second part being formed in a via hole passing through the channel layer;
    forming a channel passage layer, wherein the channel passage layer penetrates the channel layer and the first part of the second conductivity-type conduction layer in a negative direction of the first direction, and extends into an interior of the first conductivity- type substrate; and
    forming an insulating layer located in the channel layer, wherein the insulating layer surrounds a periphery of the channel passage layer,
    wherein a surface of the insulating layer facing the first conductivity-type substrate and in contact with the first part of the second conductivity-type conduction layer is flush with a bottommost surface of the channel layer facing the first conductivity-type substrate and in contact with the first part of the second conductivity-type conduction layer, and
    wherein the first conductivity-type substrate is a p-type substrate, and the second conductivity-type conduction layer is an n-type conduction layer, the first conductivity-type substrate is configured to provide a hole pumped into the channel passage layer so as to achieve an erasing operation, and the second conductivity-type conduction layer is configured to provide an electron pumped into the channel passage layer to achieve a reading operation.

8. The method according to claim 7, in a process of forming the second conductivity-type conduction layer, a substrate of the storage unit is placed upwardly to form the second conductivity-type conduction layer.

9. A three-dimensional memory, comprising the storage unit according to claim 1.

* * * * *